United States Patent [19]

Siefers

[11] Patent Number: 4,849,691
[45] Date of Patent: Jul. 18, 1989

[54] APPARATUS AND METHOD FOR ISOLATING AND CONNECTING TWO ELECTRICAL CIRCUITS

[75] Inventor: John E. Siefers, Fort Collins, Colo.
[73] Assignee: Hewlett-Packard Company, Palo Alto, Calif.
[21] Appl. No.: 14,967
[22] Filed: Feb. 17, 1987
[51] Int. Cl.$^4$ .............................................. G01R 31/02
[52] U.S. Cl. ................................. 324/158 F; 307/415; 324/73 PC
[58] Field of Search ........................ 324/158 F, 73 PC; 307/314, 415, 416, 414, 2; 332/52; 323/329, 205, 206; 361/204; 330/8

[56] References Cited

U.S. PATENT DOCUMENTS

| | | | |
|---|---|---|---|
| 1,847,079 | 3/1932 | Burton ..................................... | 330/8 |
| 2,854,587 | 9/1958 | King et al. ........................... | 307/415 |
| 2,913,688 | 11/1959 | Slebodnik et al. ................... | 307/415 |
| 4,625,164 | 11/1986 | Golder et al. ..................... | 324/158 F |
| 4,626,780 | 12/1986 | Powers et al. ................... | 324/158 F |

OTHER PUBLICATIONS

"Magnistor Devices . . . "; Electrical Manufacturing; Aug. 1959; pp. 74–77.

Primary Examiner—Ernest F. Karlsen
Attorney, Agent, or Firm—Jeffery B. Fromm

[57] ABSTRACT

An inductor used to allow in-circuit and functional testing at the same point on a test system. A inductor is used having a saturated state wherein the inductor functions to connect the test system to the device under test wherein when a large direct current passes through the wires it generates a large magnetic field saturating the core of the inductor. Thereafter, small increases or decreases in the current passing through the wires are not affected by the core since the core is already saturated. The inductor also has a not saturated state when the inductor functions to isolate the test system from the device under test in functional testing. The inductor in the not saturated state functions to minimize current flow from the test system and wires to minimize loading effects of the test system on the device under test. In-circuit and functional testing can thereby both be performed on the same plane on testing equipment as a result of the inductor serving to allow alternating states of impedance as required by alternating states of testing. The inductor functions as a switch which when closed connects the test system to the device under test for in-circuit testing and when open functions to decouple the testing system from the device under test. Use of the inductor to connect or decouple two circuits is disclosed. A method for connecting the decoupling two circuits and a method of connecting and decoupling a test system and a device under test are also disclosed.

8 Claims, 2 Drawing Sheets

APPARATUS AND METHOD FOR ISOLATING AND CONNECTING TWO ELECTRICAL CIRCUITS

BACKGROUND OF THE INVENTION

Test Systems are designed to diagnose production faults of assembled printed circuit (PC) boards which go into electronic products. Test equipment for testing various PC boards has been in use which allows in-circuit testing of the PC board, where testing is done on one element on the board to determine if a particular element on the board is working properly. In a different test of the PC board, functional testing of the PC board can be accomplished where the PC board is allowed to function as a whole to determine if the entire board is functioning properly. A typical test of a PC board then, includes incircuit testing which is then followed by a functional test of the PC board. This two-stage testing has heretofore typically been done on test equipment requiring two test fixtures or on an extensive; elaborate test fixture due to the following constraints.

In in-circuit testing, wires in the test equipment are used to connect signal sources and supply a stimulus to the device under test and a data response is carried back to the test system so that in in-circuit testing there is control over the signal source and the effects of a probe from the test system to the device under test are not of concern. In in-circuit testing there is maximum current flow through the wires, overdriving the device under test so that results at a previous node can be overridden.

In functional testing there is a stimulus supplied to the input end of the whole board under test and data is read at the output end of the board under test. Digital circuits are switching circuits which go from zero to one at a high clock rate and placing a probe on each point in the device under test will cause capacitive loading of the high clock rate digital circuit. Increased capacitance will load the circuit and will produce undesired responses on the rising and falling edges of digital signals so that the probe delays effects expected by the device under test and the fast edge response of the digital signal is altered. As the transient response observed at the device under test does not reach valid logic levels immediately, the delay can result in improper functional operation of the device under test. Also, wired in the test equipment are used to connect probes or sensors to the test system at different test points. Test signals are distorted by the impedance loading of the wires of the test equipment. Functional testing, therefore, should be done with as little loading effect as possible being perpetrated by the test instrument. To overcome this problem in functional testing, an inductor has been used in series with the device under test to change the resonant frequency so that signal quality is not affected by increased capacitance. Increased impedance to the test system and the wires minimizes the effects of the test system on the device under test and serves to isolate the device under test from the test system thereby allowing proper functional operation of the device under test.

Therefore what has been desired in the prior art is to reduce the capacitive loading of the test equipment on the device under test for functional testing and to still allow the test system to receive signals back from the device under test through the inductor for in-circuit testing.

However, the prior art implementation does not allow pulsing large direct current as generated by in-circuit testing. In the prior art, the inductor used in series with the device under test was so large that it did not saturate which delayed and distorted pulsing signals received in incircuit testing and therefore the inductor functioned to decouple the device under test from the test equipment in in-circuit testing.

Until now, these two tests, in-circuit testing and functional testing, have been performed by a test system having two test fixtures so that the loading effects of the in-circuit test system did not effect the functional testing of the PC board. This has been costly and inefficient, typically requiring the use of two test fixtures to properly test a PC board.

One manufacturer has attempted to minimize the problem by providing a two-stage test fixture whereby in-circuit testing is done on one plane with very short probes so that during in-circuit testing all the probes are connected to the board under test. For functional testing, the board under test is released half way up so that only longer probes remain in contact with the board under test to break the connection between the test system and the board under test so that there is no capacative loading. This still requires physical movement of the board under test to accomplish the two desired tests and requires the use of very expensive test equipment.

SUMMARY OF THE INVENTION

In order to overcome the problems hereinbefore described, there has been provided by the applicant's invention a new and novel use of a saturable inductor for allowing in-circuit and functional testing of a PC board at the same point on the test equipment. The saturable inductor comprises in the preferred embodiment a saturating core, at least one signal wire and at least one return path wire where one of the signal wires is wound through the core. The inductor further comprises a first saturated state for in-circuit testing wherein the inductor functions to connect the test equipment to the device under test and increased direct current flow is provided through the wires of the test system. In in-circuit testing, as current increases through the wires, the magnetic field intensity of the core of the inductor increases and the core becomes saturated and thereafter has a minimal effect on the circuit of the board under test. The inductor has a second not saturated state for functional testing wherein the inductor functions to isolate the test equipment from the device under test. During functional testing there is minimum current flow through the unused lines connected to the components of the device under test and therefore the inductor is not saturated, so that during functional testing the inductor functions to minimize the effects of the test equipment on the device under test. Although the test system is isolated from the device under test, signals may still be received from the device under test through the wires. In this manner, the inductor allows both in-circuit and functional testing of a device under test on the same plane in the same test equipment as a result of the inductor serving to allow alternating states of impedance as required by alternating states of testing.

Therefore, what is desired is a way of connecting up various probes so that they are connected during in-circuit testing but are disconnected or appear disconnected during functional testing. In other words, it is desired that the inductor function as a switch which is closed during incircuit testing when the effects of the test system on the device are not of concern and switches open for functional testing and thereby decouples the test system from the device under test in functional testing.

Accordingly, it is an object and advantage of the invention to provide a new and novel use of a saturable inductor to allow in-circuit testing and functional testing of a board on one plane on test equipment without having to move the board when alternating from one test to the other.

Another object and advantage of the invention is to provide the economical and efficient performance of incircuit and functional testing.

A further object and advantage of the invention is to provide a convenient way to perform in-circuit and functional testing with a minimum of time and effort spent to perform both tests on a board.

Yet another object and advantage of the invention is to provide the performance of in-circuit and functional testing with a minimum of mechanical constraints placed on the technician.

These and other objects and advantages will become apparent from a review of the drawings and from a study of the specification portion hereinafter describing the preferred embodiment of the invention.

DESCRIPTION OF THE PREFERRED EMBODIMENT

Figure 1:
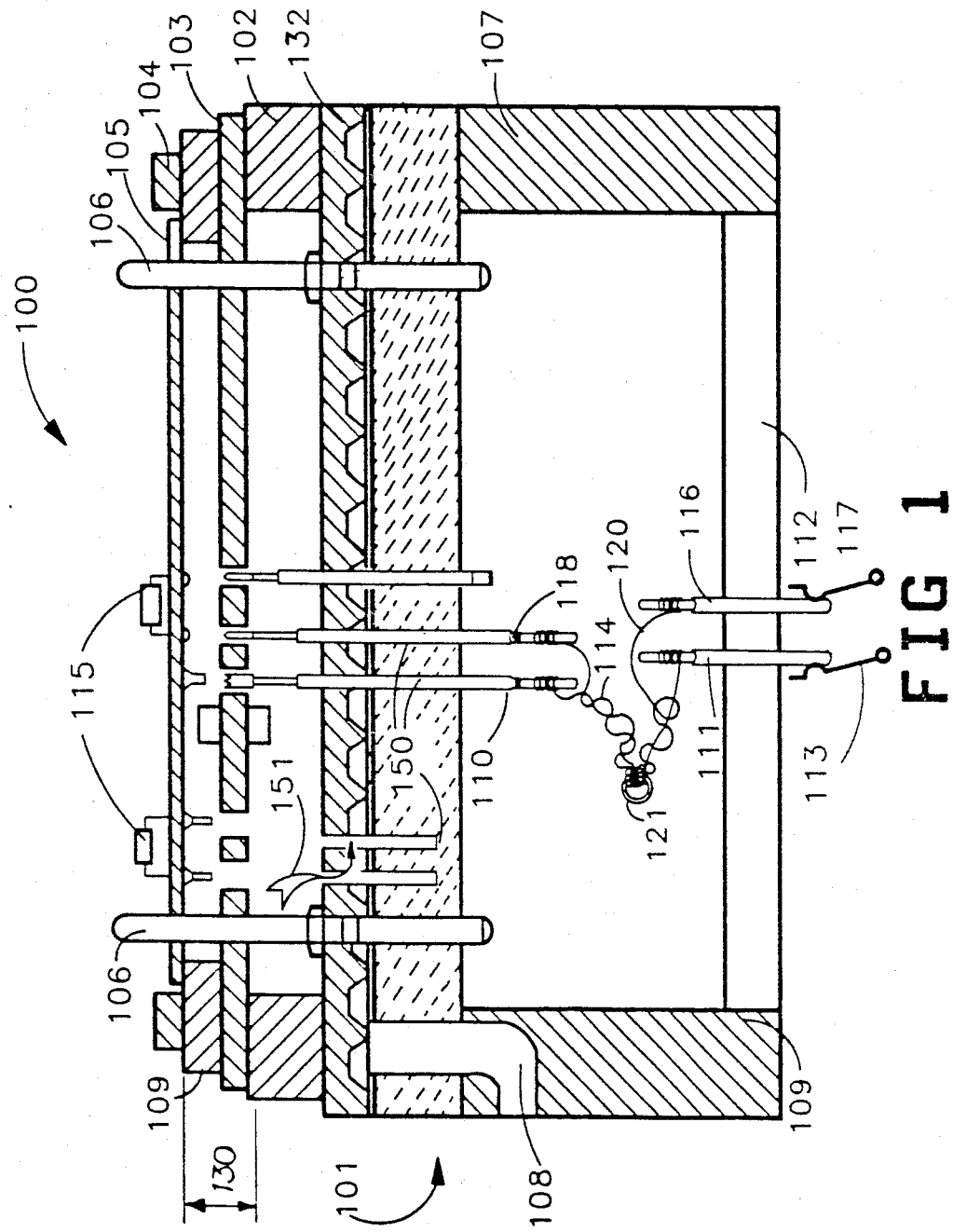
FIG. 1 is a cross-sectional view of a typical test system shown with the applicant's apparatus being used on the test system.

Referring now to the drawings in general, and in particular to FIG. 1 of the drawings, there is shown a cross-sectional view of a typical board test fixture. The test system is shown generally by the numeral 100. The test system 100 is used to test a circuit board 105. The circuit board 105 typically is positioned on seals 109 and 104. Fixture plate assemble 101 supports seal 102 and support plate 103 supports seal 104 and the circuit board 105 is positioned on seals 104 and 109. The circuit board 105 is properly aligned to the test fixture by use of alignment pins 106. A vacuum is created from air flow at 151 through the vacuum manifold 108 and serves to hold the circuit board 105 onto the test system 100. Associated with the circuit board 105 that is being tested are probing means 110 and 118 which are attached to fixture plate assembly 101. The test system 100 has a scanner plate 112, the scanner plate 112 having attached thereto scanner pins 111 and 116. The scanner pins 111 and 116 contact paddle pins 113 and 117 to transfer signals into the test system electronics. Attached to scanner pin 116 at the end opposite to paddle pin 117 is signal wire 120, and attached to scanner pin 111 at the end opposite to paddle pin 113 is return path wire 114. In the preferred embodiment, return path wire 114 and signal wire 120 form a twisted pair wire from the scanner pins 111 and 116 of the test system 100. The signal wire 120 and the return path wire 114 separate as they approach core 121 and signal wire 120 is positioned through the core 121 and in the preferred embodiment, signal wire 120 is wound around the core 121 four times. As signal wire 120 passes through core 121, it is reunited with return path wire 114 and again forms a twisted pair wire which is then separated to attach to the probing means 110 and 118. In this way, return path wire 114 is connected to probing means 110 and signal wire 120 is connected to probing means 118 so that the core 121 has been connected in series between the test system 100 and the circuit board 105 that is being tested.

Figure 2:
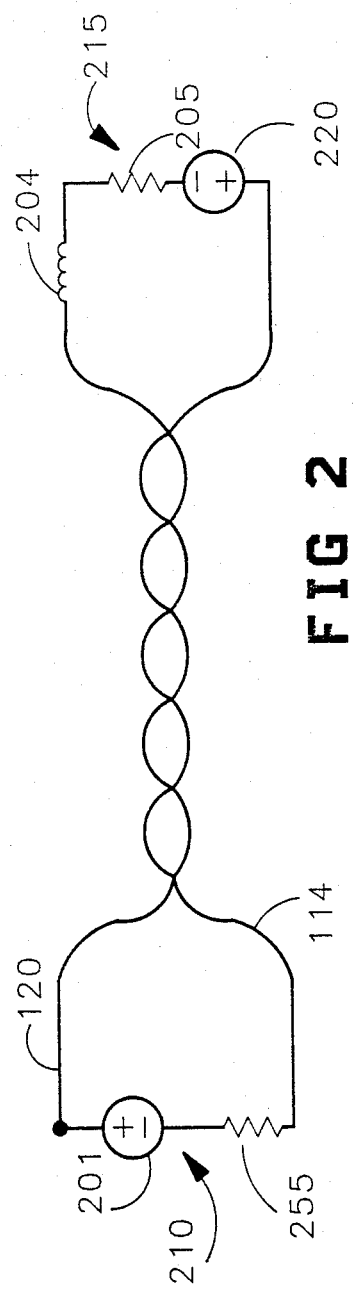
FIG. 2 is a diagrammatic view showing applicant's apparatus as it functions between a first circuit and a second circuit.

Referring now to FIG. 2 of the drawings, there is shown a diagrammatic view of the applicant's apparatus as it is positioned between a first circuit and a second circuit. In FIG. 2 there is shown a voltage source 201 and an impedance 225 in a first circuit 210. The voltage source 201 has extending therefrom a signal wire 120 at one end and a return path wire 114 at the other end. Upon leaving the voltage source 201, return path wire 114 and signal wire 120 unite to form a twisted pair wire. Signal wire 120 separates from the twisted pair and connects to the inductor 204 which is in series with load 205 of a second circuit 215. The second circuit 215 also has a voltage source 220. Between the voltage source 201 in the first circuit 210 and the load 205 in the second circuit 215, the return path wire 114 and the signal wire 120 remain in a twisted pair configuration except when the signal wire 120 is positioned through the inductor 204.

This twisted pair wire configuration provides noise isolation from the first circuit 210 to the second circuit 215 and thereby reduces the susceptibility of the second circuit 215 to stray magnetic fields and provides further control of impedance to the current in the wires 114 and 120.

Figure 3:
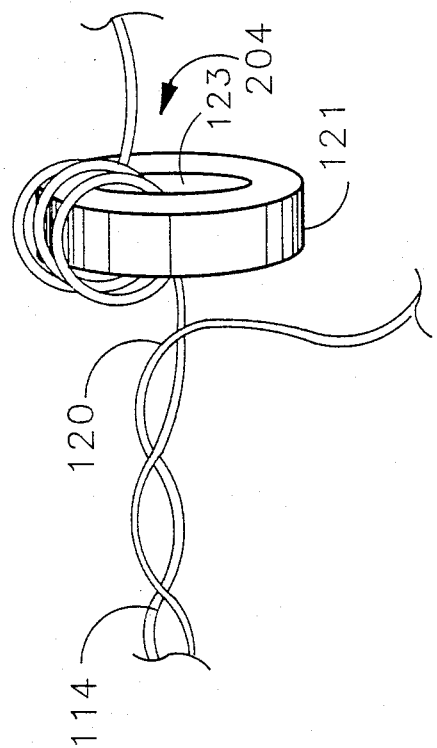
FIG. 3 is a perspective view of applicant's apparatus showing the core of the apparatus greatly enlarged.

In FIG. 2, the core 121 shown in FIG. 3 of the inductor 204 has a saturated state wherein the core 121 in FIG. 3 serves to connect the first circuit 210 to the second circuit 215. When a large direct current passes through the wires 114 and 120, it generates a large magnetic field saturating the core 121. Thereafter, small increases or decreases in the current passing through the wires 114 and 120 are not affected by the core 121 since the core 121 is already saturated. Therefore, when the core 121 of the inductor 204 is saturated, the first circuit 210 and the second circuit 215 are effectively connected together. In the saturated state of the core 121, voltage source 201 acts as the driver and load 205 acts as the load. With large current, the first circuit 210 drives the second circuit 215.

In the board testing application as seen in FIG. 1, the core 121 has a saturated state in which the core 121 serves to connect the circuit board 105 to the testing system 100. In the board testing system application of FIG. 1, during in-circuit testing the test system 100 generates pulsing direct current through the wires 114 and 120 which saturates the core 121 whereby the core 121 has no effect on the circuit board 105 under test and the circuit board 105 is thereby connected to the testing system 100. In in-circuit testing, the testing system 100 is the driver and the circuit board 105 under test is the load. With large current, the testing system 100 drives the circuit board 105 under test.

Referring back to FIG. 2, the core 121 shown in FIG. 3 of the inductor 204 also has a not saturated state in which the core 121 serves to isolate the first circuit 210 from the second circuit 215. When the core 121 in FIG. 3 is in its not saturated state, the voltage source 220 in the second circuit 215 becomes the driver and the impedance 225 is large. Since there is very little current flowing from the voltage source 220 in the second circuit 215, the core is not saturated and the inductor 204 serves to further impede the current from the first circuit 210 to the second circuit 215. With a small current, the second circuit 215 drives the first circuit 210.

In the board testing system application as seen in FIG. 1, the core 121 also has a not saturated state in which the core 121 allows functional testing of the entire board under test 105. In functional testing, the entire circuit board 105 under test is being tested instead of single nodes as in in-circuit testing, so in functional testing there remain a number of unused or inactive nodes. In functional testing, the circuit board 105 under test is the driver and the testing system 100 is the load for the inactive nodes of the circuit board 105 under test. These unused nodes are presented with a high impedance load and the inductor 204 serves to further impede the current from the test system 100 to the circuit board 105 under test. During functional testing, the circuit board 105 under test drives the testing system 100 with little or no current. Little or no direct current is sent through the wires 114 and 120 in FIG. 1 and there is a small or no magnetic field intensity in the core 121. In the board testing system application of FIG. 1, the not saturated state of the core 121 serves to isolate the circuit board 105 under test from the testing system 100.

Therefore, in the testing system application of FIG. 1, the inductor 204 allows in-circuit testing and functional testing on one plane as shown by dimension line 130 in FIG. 1 on a test equipment system 100 as a result of the core 121 serving to allow alternating states of impedance as required by the alternating states of testing. The one plane as shown by dimension line 130 in FIG. 1 can be defined as a point or position wherein the circuit board 105 under test remains in that same point or position for both in-circuit and functional testing.

In FIG. 3 there is shown a perspective view of the applicant's apparatus greatly enlarged for the purposes of illustration, in the form of an inductor shown generally by the number 204. The inductor 204 has a core 121 and signal wire 120 is positioned through the inner opening 123 of the core 121. In the preferred embodiment, the signal wire 120 is then wound around the core 121 four turns. In the preferred embodiment, winding the signal wire 120 through the core 121 four turns has yielded rapid increases in the magnetic field intensity of the core 121 with increasing current through the wires 114 and 120. Also, in the preferred embodiment, the core 121 and one signal wire 120 have an inductance range of eight to twelve microhenries. In the preferred embodiment, the core 121 has a permeability of approximately 10,000 times the permeability of free space. In FIG. 3, the core 121 is shown in a circular configuration. Other core shapes are within the spirit and scope of the invention; however, there must be a closed magnetic path. In FIG. 3 it can be seen that signal wire 120 and return path wire 114 form a twisted pair configuration and as the wires 114 and 120 approach the core 121 the signal wire 120 is positioned through the inner opening of the core 123 and the signal wire 120 is wound around the core 121 four turns.

Also disclosed is a method of controlling impedence from a first circuit 210 in FIG. 2 to a second circuit 215 in FIG. 2 which comprises the steps of providing, as shown in FIG. 3, a core 121, at least on signal wire 120 and at least one return path wire 114. One of the signal wires 120 is positioned through the inner opening of the core 123 as shown in FIG. 3 at least one turn. Referring back to FIG. 2, one end of each wire 114 and 120 is connected to the first circuit 210 and the opposite end of each wire 120 and 114 is connected to the second circuit 215. A first saturated state is provided within the core 121 by using the core 121 to connect the first circuit 210 to the second circuit 215 whereby increased current through the wires 114 and 120 increases the magnetic field intensity of the core 121 until the core 121 becomes saturated and thereby on further increases or decreases in current the core 121 has no effect on the second circuit 215 and low impedance is provided to the wires 114 and 120. A second not saturated state is also provided within the core 121 by using the core to isolate the first circuit 210 in FIG. 2 from the second circuit 215 in FIG. 2. The voltage source 220 in the second circuit 215 causes minimal current and the inductor 204 serves to further impede the current from the first circuit 210 to the second circuit 215 in FIG. 2. The saturated state and the not saturated state of the core 121 are alternated thereby presenting alternating states of impedance to the second circuit 215.

A method is also disclosed wherein the before-described technique is applied to a board testing system as shown in FIG. 1 and the saturated state of the core 121 is used for in-circuit testing, wherein the in-circuit test generates pulsing direct current into the core 121 and as direct current increases, the magnetic field intensity of the core 121 increases and the core 121 becomes saturated and has no effect on the circuit board under test 105 and low impedance is provided to the test system 100 and to the wires 114 and 120. The not saturated state of the core 121 is used for functional testing wherein the core 121 functions to isolate the test system 100 from the circuit board 105 under test as shown in FIG. 1. In the not saturated state of the core 121, used in functional testing, current from the circuit board 105 under test is minimal and the inductor 204 serves to further impede the current from the test system 100 to the circuit board 105 under test. Thereby as direct current decreases, the magnetic field intensity of the core 121 decreases and the core 121 functions to minimize the effects of the test system 100 on the circuit board 105 under test and serves to isolate the circuit board under test 105 from the test system 100. In the method described for the testing system application, the core 121 thereby allows in-circuit testing and functional testing on one plane as shown by dimension line 130 in FIG. 1 on a test system 100 as a result of the core 121 serving to allow alternating states of impedance as required by the alternating states of testing.

From the foregoing, it can be seen that there has been accomplished by the applicant's invention all of the objects and advantages of the invention. Nevertheless, variations in the structure of the invention and the arrangement of the various parts are within the spirit and scope of the applicant's invention. The embodiments given have been given only by way of illustration and the applicant is not to be limited to the embodiments shown and described.

Having described my invention, I claim:

1. An apparatus for use with a first circuit and a second circuit comprising:
    (a) a magnetic core having an inner opening;
    (b) at least one signal and control wire, the signal and control wire being one wire, and at least one common return path wire, the wires each having two ends, a single one of the signal and control wires being wound through the inner opening of the core at least one turn, the signal and control wires and the common return path wires being attached at one end to the first circuit and at the other end to the second circuit;

(c) a first saturated state associated with the core wherein the core and the single signal and control wire functions to connect the first circuit to the second circuit, wherein the signal and control wire functions as a control wire, and current is flowing, whereby as direct current increases through the wires, magnetic field intensity of the core becomes saturated, the core being saturated magnetically by electric current through the control wire, and the core has no effect on the circuits, and low impedance is provided to the first circuit and to the wires;

(d) a second not saturated state associated with the core wherein the core and the single signal and control wire serve to isolate the first circuit from the second circuit, wherein the signal and control wire functions as a signal wire, and there is no current flow, whereby there is a large impedance that isolates the first circuit and the wires from the second circuit; and (e) whereby alternating states of current flow through the wires allow the core to present alternating states of impedance.

2. The apparatus of claim 1 wherein the magnetic core and one signal and control wire have an inductance range of eight to twelve microhenries.

3. The apparatus of claim 1 wherein the signal and control wire and the return path wire are a twisted pair to provide lower inductance and further control of impedance to reduce susceptibility of the second circuit to stray magnetic fields.

4. The apparatus of claim 1 wherein one of the signal and control wires is wound through the inner opening of the core four turns.

5. An apparatus for use in an incircuit and functional testing system, the testing system having at least one circuit, used with a device under test, the device under test having at least one circuit, comprising:

(a) a magnetic core having an inner opening; the magnetic core being positioned between the circuit of the device under test and the circuit of the test system;

(b) at least on signal and control wire, the signal and control wire being one wire, and at least one common return path wire, each wire having two ends, each wire attached at one end to one of the circuits of the testing system and at the opposite end to one of the circuits of the device under test, a single one of the signal and control wires being wound through the inner opening of the core at least one turn;

(c) a first saturated state associated with the core for in-circuit testing wherein the in-circuit test generates pulsing direct current from the test system and the wires into the core, wherein the signal and control wire functions as a control wire, and current is flowing; whereby as direct current increases magnetic field intensity of the core increases and the core becomes saturated, the core being saturated magnetically by electric current through the single signal and control wire, and the core has no effect on the circuit of the device under test, and low impedance is provided to the test system and the wires;

(d) a second not saturated state associated with the core for functional testing wherein the core and the single signal and control wire function to isolate the circuit of the test system from the circuit of the device under test, wherein the signal and control wire functions as a signal wire, and there is no current flow, whereby there is a large impedance that isolates the circuit of the test system from the circuit of the device under test, thereby as direct current flow decreases, magnetic field intensity of the core decreases and the core and the single signal and control wire functions to minimize the effects of the test system of the device under test and isolates the device under test from the test system;

(e) whereby the core allows in-circuit testing and functional testing on one plane in the test system as a result of the core serving to allow alternating states of impedance as required by alternating states of testing.

6. The apparatus of claim 5 wherein the magnetic core and one signal and control wire have an inductance range of eight to twelve microhenries.

7. The apparatus of claim 5 wherein the signal and control wire and the return path wire are a twisted pair to provide lower inductance and further control of impedance to reduce susceptibility of the testing system to stray magnetic fields.

8. The apparatus of claim 5 wherein one of the signal and control wires is wound through the inner opening of the core four turns.

* * * * *

UNITED STATES PATENT AND TRADEMARK OFFICE
CERTIFICATE OF CORRECTION

PATENT NO. : 4,849,691

DATED : July 18, 1989

INVENTOR(S) : John E. Siefers

It is certified that error appears in the above-identified patent and that said Letters Patent is hereby corrected as shown below:

In the specification:

Column 1, line 18, "incircuit" should be -- in-circuit --;

Column 2, line 68, "incircuit" should be -- in-circuit --;

Column 3, line 11, "incircuit" should be -- in-circuit --;

Column 7, line 38, "incircuit" should be -- in-circuit --;

In the claims:

Column 7, line 46, "on" should be -- one --;

In the abstract:

Line 2, "A inductor" should be -- An inductor --.

UNITED STATES PATENT AND TRADEMARK OFFICE
CERTIFICATE OF CORRECTION

PATENT NO. : 4,849,691

DATED : July 18, 1989

INVENTOR(S) : John E. Siefers

It is certified that error appears in the above-identified patent and that said Letters Patent is hereby corrected as shown below:

Figure 2 has a resistor labelled 255 which should be labelled 225.

Signed and Sealed this

Twenty-eighth Day of August, 1990

*Attest:*

HARRY F. MANBECK, JR.

*Attesting Officer*    *Commissioner of Patents and Trademarks*